United States Patent
Nagase et al.

(10) Patent No.: US 8,062,486 B2
(45) Date of Patent: Nov. 22, 2011

(54) LITHIUM-CONTAINING TRANSITION METAL OXIDE TARGET, PROCESS FOR PRODUCING THE SAME AND LITHIUM ION THIN FILM SECONDARY BATTERY

(75) Inventors: Ryuichi Nagase, Ibaraki (JP); Yoshio Kajiya, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 574 days.

(21) Appl. No.: 12/297,320

(22) PCT Filed: Apr. 27, 2007

(86) PCT No.: PCT/JP2007/059176
§ 371 (c)(1),
(2), (4) Date: Oct. 16, 2008

(87) PCT Pub. No.: WO2008/012970
PCT Pub. Date: Jan. 31, 2008

(65) Prior Publication Data
US 2009/0166187 A1    Jul. 2, 2009

(30) Foreign Application Priority Data
Jul. 27, 2006   (JP) ................................. 2006-204564

(51) Int. Cl.
*C23C 14/00* (2006.01)
*C25B 11/00* (2006.01)
(52) U.S. Cl. ............................... 204/298.13; 204/192.17
(58) Field of Classification Search ............. 204/192.17, 204/298.13
See application file for complete search history.

(56) References Cited

U.S. PATENT DOCUMENTS

| | | | |
|---|---|---|---|
| 6,497,854 B2 | 12/2002 | Kohiro et al. | |
| 6,982,132 B1 * | 1/2006 | Goldner et al. | 429/162 |
| 7,288,242 B2 | 10/2007 | Tasaki et al. | |
| 7,799,301 B2 | 9/2010 | Kajiya et al. | |
| 2004/0241084 A1 | 12/2004 | Kajiya et al. | |
| 2005/0265909 A1 | 12/2005 | Kajiya et al. | |
| 2006/0121350 A1 | 6/2006 | Kajiya et al. | |
| 2009/0200508 A1 | 8/2009 | Nagase et al. | |
| 2011/0031437 A1 | 2/2011 | Nagase et al. | |
| 2011/0065002 A1 | 3/2011 | Nagase | |

OTHER PUBLICATIONS

English Abstract of JP 2005-251417.
English Abstract of JP 2004-335192.
English Abstract of JP 2003-217580.
English Abstract of JP 2002-338354.
English Abstract of JP 08-198677, 1996.
English Abstract of JP 01-294364, 1989.
English Abstract of JP 11-307094, 1999.
English Abstract of JP 2005-285572.
English Abstract of JP 2003-059490.
English Abstract of JP 02-221379, 1990.
English Abstract of JP 2002-304993.

* cited by examiner

*Primary Examiner* — Christopher Young
(74) *Attorney, Agent, or Firm* — Howson & Howson LLP

(57) ABSTRACT

Proposed are a lithium-containing transition metal oxide target formed from a sintered compact of lithium-containing transition metal oxides showing a hexagonal crystalline system in which the sintered compact has a relative density of 90% or higher and an average grain size of 1 µm or greater and 50 µm or less, and a lithium-containing transition metal oxide target formed from a sintered compact of lithium-containing transition metal oxides showing a hexagonal crystalline system in which the intensity ratio of the (003) face, (101) face and (104) face based on X-ray diffraction using CuKα ray satisfies the following conditions: (1) Peak intensity ratio of the (101) face in relation to the (003) face is 0.4 or higher and 1.1 or lower; and (2) Peak ratio of the (101) face in relation to the (104) face is 1.0 or higher. In addition to this lithium-containing transition metal oxide target optimal for forming a thin film positive electrode for use in a thin film battery such as a three-dimensional battery and a solid state battery, also proposed are its production method and a lithium ion thin film secondary battery. In particular, the present invention aims to propose a positive electrode target capable of obtaining a thin film with superior homogeneity.

14 Claims, No Drawings

LITHIUM-CONTAINING TRANSITION METAL OXIDE TARGET, PROCESS FOR PRODUCING THE SAME AND LITHIUM ION THIN FILM SECONDARY BATTERY

BACKGROUND OF THE INVENTION

The present invention generally relates to a lithium-containing transition metal oxide target optimal for forming a thin film positive electrode for use in a thin film battery such as a three-dimensional battery and a solid state battery, its production method, and a lithium ion thin film secondary battery. In particular, the present invention relates to a target formed from lithium-containing transition metal oxides showing a hexagonal crystalline system, its production method, and a lithium ion thin film secondary battery.

In recent years, there is a rapidly growing demand for a non-aqueous lithium secondary battery as a high energy density battery. This lithium secondary battery is configured from three fundamental components; namely, a positive electrode, a negative electrode, and a separator retaining an electrolyte interposed between these electrodes.

As the positive electrode and negative electrode, a slurry obtained by mixing and dispersing active materials, conductive materials, bonding materials and plasticizing agents (where appropriate) in a dispersion medium is used by being supported by a collector such as a metallic foil or a metallic mesh.

A composite oxide of lithium and transition metal is used as the cathode active material of a battery as represented by cobalt composite oxide, nickel composite oxide, and manganese composite oxide. These lithium composite oxides are generally synthesized by mixing the compound of the main element (carbonate or oxide of Mn, Fe, Co, Ni and the like) and the lithium compound (lithium carbonate and the like) at a prescribed ratio, and subjecting this to heat treatment (oxidation treatment) (refer to Patent Document 1, Patent Document 2 and Patent Document 3).

In addition, proposed is a ternary positive electrode material having a composition of Ni:Mn:Co=1:1:1 in which the Li/metal ratio is 0.97 to 1.03, and capable of obtaining a discharged capacity of 200 mAh/g (refer to Patent Document 4).

Furthermore, proposed are a cathode active material for use in a lithium secondary battery obtained by adjusting the ratio of Mn, Co, Ni to a prescribed ratio and calcinating this in an oxygen atmosphere (refer to Patent Document 5), and a production method of a cathode active material for use in the lithium secondary battery (refer to Patent Document 6).

Under these circumstances, the thinning of electrode films for shortening the diffusion distance of lithium ion is demanded to meet the needs of achieving even higher output of lithium secondary batteries. This is because, if the thinning of electrode films can be achieved, the battery can be miniaturized significantly. In addition, the thinning of electrode films is crucial technology in three-dimensional batteries and solid state batteries.

With the current production methods of electrode films using a cathode active material for use in secondary batteries as shown in Cited Documents 1 to 6, for instance, with a positive electrode, a conductive material (carbon material such as acetylene black or the like) is mixed with the cathode active material, this mixed powder is added to a binder (for instance, fluorinated resin as represented by pVdF) dissolved in an organic solvent (for instance, NMP: N-methylpyrrolidone), evenly kneaded, this slurry is applied on a collector (for instance, Al foil), dried, and subsequently pressed to obtain an electrode film. Thus, the thickness of the electrode will generally be 50 to 100 um, and sufficient thinning of the film cannot be achieved.

As one method of thinning the electrode film, a wet process as represented by the sol-gel method may be considered. Nevertheless, although this wet method is advantageous in that the thin film can be manufactured inexpensively and simply in terms of the apparatus that is used, there is a drawback in that industrial mass production is difficult.

As an alternative method, a method of forming a thin film with a dry method, in particular the use of the sputtering method may be considered. This sputtering method is advantageous in that the adjustment of the deposition conditions is easy, and [films] can be easily deposited on the semiconductor substrate.

Nevertheless, when performing deposition with the sputtering method, a target for supplying elements to be deposited is indispensible. Generally speaking, a target needs to be prepared to match the composition of the film to be prepared, and the target must not cause any problems during the deposition.

Technology of using this sputtering method to deposit a cathode active material for use in a lithium secondary battery is rare. The reason for this is that there is a possibility that a difference will arise in the component composition between the positive electrode substrate for use in a lithium secondary battery of the sputtering target and the deposited cathode active material for use in the lithium secondary battery, and that it is assumed that it is impossible to obtain a high density target of a level capable of achieving uniform deposition. Thus, in a very real sense, it is necessary to overcome these drawbacks.

Some examples of using this sputtering method to deposit a cathode active material for use in a lithium secondary battery are listed below. Nevertheless, all of these examples relate to a limited composition ($LiCoO_2$), and none of these examples disclose a means for overcoming the foregoing problems concerning the sputtering target.

Technology of annealing and crystallizing thin film amorphous of $LiCoO_2$ formed using the sputtering method at 650 to 900° C. in an Ar or $O_2$ atmosphere when preparing a $LiCoO_2$ thin film positive electrode (Non-Patent Document 1), technology of obtaining $LiCoO_2$ thin films with nanocrystalline structure with (104) preferred orientation on Si covered with Pt using RF magnetron sputtering, and reducing the grain size through annealing at 500 to 700° C. (Non-Patent Document 2), technology of biasing the substrate and performing RF sputtering thereto, and thereby forming a $LiCoO_2$ thin film for use in a positive electrode of a microbattery (Non-Patent Document 3), and technology of adjusting the RF output upon forming a $LiCoO_2$ thin film by way of RF sputtering, and obtaining a nanocrystalline thin film with (101) and (104) preferred orientations (Non-Patent Document 4).

The problem arising under these disclosed sputtering methods is the target, and the target greatly influences the deposition characteristics. Nevertheless, the foregoing disclosed documents do not discuss what kind of target is optimal and what kind of production method should be used regarding a target for forming a thin film of a lithium secondary battery positive electrode.

[Patent Document 1] Japanese Patent Laid-Open Publication No. H1-294364

[Patent Document 2] Japanese Patent Laid-Open Publication No. H1-307094

[Patent Document 3] Japanese Patent Laid-Open Publication No. 2005-285572

[Patent Document 4] Japanese Patent Laid-Open Publication No. 2003-59490

[Patent Document 5] Japanese Patent Laid-Open Publication No. H2-221379

[Patent Document 6] Japanese Patent Laid-Open Publication No. 2002-304993

[Non-Patent Document 1] "Characteristics of thin film cathodes according to the annealing ambient for the post-annealing process" Journal of Power Sources 134 (2004)103-109

[Non-Patent Document 2] "Lithium cobalt oxide film prepared by rf sputtering" Journal of Power Sources 128 (2004)263-269

[Non-Patent Document 3] "Bias sputtering and characterization of $LiCoO_2$ thin film cathodes for thin film microbattery" Materials Chemistry and Physics 93 (2005)70-78

[Non-Patent Document 4] "As-deposited $LiCoO_2$ thin film cathodes prepared by rf magnetron sputtering" Electrochimica Acta 51 (2005)268-273

SUMMARY OF THE INVENTION

In light of the above, the present inventors propose a lithium-containing transition metal oxide target optimal for forming a thin film positive electrode for use in a thin film battery such as a three-dimensional battery and a solid state battery, as well as its production method and a lithium ion thin film secondary battery. In particular, the present invention aims to propose a positive electrode target capable of obtaining a thin film with superior homogeneity.

In order to achieve the foregoing object, the present invention provides:

1) A lithium-containing transition metal oxide target formed from a sintered compact of lithium-containing transition metal oxides showing a hexagonal crystalline system, wherein the sintered compact has a relative density of 90% or higher and an average grain size of 1 µm or greater and 50 µm or less. It is extremely important that the sintered compact target has a relative density of 90% or higher and an average grain size of 1 µm or greater and 50 µm or less in order to form a lithium-containing transition metal oxide thin film. In addition to making sure that the component composition of the intended film does not change, a sputtered film requires uniformity and it is also necessary to form a stable film without the generation of particles, and the foregoing requirements are conditions that are essential in achieving the present invention.

Moreover, although these conditions are the common problem of all targets formed from lithium-containing transition metal oxides when producing an optimal thin film positive electrode formed from lithium-containing transition metal oxides showing a hexagonal crystalline system, the present invention is able to overcome these problems.

2) A lithium-containing transition metal oxide target formed from a sintered compact of lithium-containing transition metal oxides showing a hexagonal crystalline system, wherein the sintered compact has a relative density of 90% or higher and an average grain size of 1 µm or greater and 50 µm or less, and wherein the intensity ratio of the (003) face, (101) face and (104) face based on X-ray diffraction using CuKα ray satisfies the following conditions:
   (1) Peak ratio of the (101) face in relation to the (003) face is 0.4 or higher and 1.1 or lower; and
   (2) Peak ratio of the (101) face in relation to the (104) face is 1.0 or higher.

The intensity ratio of the (003) face, (101) face and (104) face also greatly influences the generation of particles. As shown in the Examples and Comparative Examples described later, particles will arise if the conditions are outside the scope of conditions (1) and (2) above. The effect of inhibiting the generation of particles was acknowledged within the foregoing conditions. In other words, it is evident that the independent adjustment of the intensity ratio of the (003) face, (101) face, and (104) face yields an effect of inhibiting the generation of particles.

3) A lithium-containing transition metal oxide target formed from a sintered compact of lithium-containing transition metal oxides showing a hexagonal crystalline system, wherein the intensity ratio of the (003) face, (101) face and (104) face based on X-ray diffraction using CuKα ray satisfies the following conditions:
   (1) Peak ratio of the (101) face in relation to the (003) face is 0.4 or higher and 1.1 or lower; and
   (2) Peak ratio of the (101) face in relation to the (104) face is 1.0 or higher.

Here, the intensity ratio of the (003) face, (101) face, and (104) face has been adjusted and additionally includes the conditions of the sintered compact having a relative density of 90% or higher and an average grain size of 1 µm or greater and 50 µm or less. Needless to say, the effect of inhibiting the generation of particles is high, and quality lithium ion thin film can be obtained through stable sputtering. to 3) above, wherein the transition metal is at least one selected from Ni, Co, and Mn.

5) A production method of a lithium-containing transition metal oxide target comprising the steps of using lithium-containing transition metal salt in which the molar ratio of Li/transition metal is 1.1 or more and 1.3 or less as the raw material, oxidizing this to create lithium-containing transition metal oxides showing a hexagonal crystalline system, and pressing and sintering the lithium-containing transition metal oxides to obtain a sintered compact having a relative density of 90% or higher and an average grain size of 1 µm or greater and 50 µm or less.

Like this, by adjusting the molar ratio of the Li/transition metal to be 1.1 or more and 1.3 or less at the stage of the precursor, it is possible to increase the homogeneity of the film, suppress variations in the composition, and prevent the generation of particles.

6) The production method of a lithium-containing transition metal oxide target according to 5) above, wherein the lithium-containing transition metal oxide target is formed from a sintered compact of lithium-containing transition metal oxides showing a hexagonal crystalline system, and wherein the intensity ratio of the (003) face, (101) face and (104) face based on X-ray diffraction using CuKα ray satisfies the following conditions:
   (1) Peak ratio of the (101) face in relation to the (003) face is 0.4 or higher and 1.1 or lower; and
   (2) Peak ratio of the (101) face in relation to the (104) face is 1.0 or higher.

7) The production method of a lithium-containing transition metal oxide target according to 5) or 6) above, wherein the transition metal is at least one selected from Ni, Co, and Mn.

8) A lithium ion thin film secondary battery, wherein a thin film obtained by sputtering the lithium-containing transition metal oxide target according to any one of 1) to 5) above is used as the cathode active material.

The lithium-containing transition metal oxide target of the present invention has an extremely high relative density of 90% or higher and fine grains in which the average grain size is adjusted to 1 µm or greater and 50 µm or less. Thus, since the intensity ratio of the (003) face, (101) face, and (104) face is adjusted optimally, a superior effect is yielded in that it is possible to obtain a thin film formed from a cathode active material having stable quality in which the uniformity of the sputtered film is favorable, there are no generation of particles during sputtering, the deposition yield can be improved.

DETAILED DESCRIPTION OF THE INVENTION

Upon producing the lithium-containing transition metal oxide target of the present invention, a precursor containing all elements configuring the film composition is prepared in advance, and this is oxidized to prepare a raw target material. The target is prepared by pressing and sintering this raw material.

The raw material of the target material is a lithium-containing transition metal oxide showing a hexagonal crystalline system. Specifically, the raw material used may be lithium cobalt oxide ($LiCoO_2$), lithium nickel oxide ($LiNiO_2$), a solid solution selected among the foregoing two types and lithium manganese oxide lithium ($LiMnO_2$) in an arbitrary composition ($LiMnCoO_2$, $LiMnNiO_2$, $LiCoNiO_2$), and a solid solution selected from the three types in an arbitrary composition ($LiMnCoNiO_2$).

These oxides showing a hexagonal crystalline system are used as the raw material, and the raw material is pressed and sintered to prepare the target. The target also shows a hexagonal crystalline structure.

It is important that the precursor is composed of all elements including lithium configuring the film composition in advance. Thereby, in addition to the effect of being able to seek the uniformity of the composition, variation in the composition during deposition can also be inhibited as much as possible.

Variation in the composition during deposition is inevitable since the sintering temperature after pressing becomes higher in comparison to the oxidation treatment temperature of the precursor. Therefore, it is necessary to make the molar ratio of the Li/transition metal to be 1.1 or greater, particularly 1.1 or greater and 1.3 or less.

If this molar is less than 1.1, the composition is assumed to fall below the stoicheiometric level due to the dispersion of Li. Contrarily, if this molar ratio exceeds 1.3, the Li ratio will increase, which will hinder the homogenization of the film during deposition, become the cause of nodules, and cause the generation of particles in the film.

Preferably, the target has a relative density 90% or higher, and an average grain size of 1 to 50 μm. The relative density is related to the generation of nodules in the target, and the relative density being less than 90% is not preferable since the probability of the generation of nodules will increase and induce the generation of particles during deposition. Preferably, the relative density is 92% or higher, and more preferably 95% or higher.

The average grain size is related to the film uniformity, and preferably the average grain size is 1 m or greater and 50 μm or less, and more preferably 5 μm or greater and 40 μm or less. Meanwhile, if the average grain size is less than 1 μm, this is not preferable since it is difficult to improve the relative density. If the average grain size exceeds 50 μm, it will become difficult to maintain the film uniformity. The average grain size being outside the foregoing scope is not preferable since the generation of particles will increase.

As a result of measuring the target of the present invention showing a hexagonal crystalline system with the X-ray diffraction method using a CuKα ray and examining the peak intensity in detail, the following characteristics were discovered in comparison to the X-ray diffraction of normal lithium-containing transition metal oxide powder. These characteristics are unique to the target of the present invention.

In other words, the target of the present invention has the following significant characteristics: (1) the ratio I(101)/I (003) of the peak intensity I(101) of the (101) face in relation to the peak intensity I(003) of the (003) face is 0.4 or higher and 1.1 or less, and (2) the ratio I(101)/I(104) of the peak intensity I(101) of the (101) face in relation to the peak intensity I(104) of the (104) face is 1.0 or higher. The relationship of the peak intensity measured by the X-ray diffraction method defines the lithium-containing transition metal oxide target of the present invention.

The method disclosed in Japanese Patent Laid-Open Publication No. 2005-285572 can be used for producing the lithium-containing transition metal oxides. With the precursor of the target for use in the positive electrode material manufactured with this method, since the respective metal elements are uniformly dispersed at a nano-level, this is preferable in producing a denser target.

For example, a metal salt solution of one or more types of metal elements selected from Mn, Co and Ni is prepared, lithium carbonate is suspended in water, and the prepared metal salt solution is charged in the lithium carbonate suspension to manufacture a precursor (carbonate). Soluble salt may be used in the metal salt solution; specifically, the solutions of chloride, sulfate, nitrate and the like may be used. Here, metal salt aqueous solution of small amounts of heterogeneous elements (doped elements known as elements that are known to improve the battery characteristics) such as Al, Si, Mg, Ca, Ti or Cr may also be added. The present invention covers all of the foregoing aspects.

The amount of lithium carbonate suspension (w: mole) can be decided according to the following formula.

[$w$=amount of all metal components (mole)×(1+0.5$x$)]
(provided that $x$: Li content/amount of all metal components required in the positive electrode material)

The carbonate cake prepared as described above is filtered, cleansed, and dried to obtain Li-containing composite metal carbonate powder. The obtained carbonate is further cleansed with saturated lithium carbonate solution or ethanol. The obtained carbonate precursor is subject to oxidation treatment in the atmosphere at 800 to 1100° C. for 1 to 10 hours. The processes of filtering, cleansing, drying and oxidization can be performed using standard industrial methods. In other words, filtration under reduced pressure, filter press or the like can be used for the filing and cleansing processes, and a stewing furnace, continuous kiln, spray drying or the like may be used for the drying and oxidization processes.

The size of the aggregate of the lithium-containing transition metal oxide particles subject to oxidation treatment is controlled as needed. Size control can be performed with standard industrial methods such as using a pulverizer or classifier. The lithium-containing transition metal oxide particles manufactured as described above are additionally sintered in the atmosphere to obtain a target.

Examples and Comparative Examples of the present invention are now explained. Incidentally, these examples are merely illustrative, and the present invention shall in no way be limited thereby. In other words, the present invention shall include the various modes and modifications covered by the technical spirit of this invention.

With lithium carbonate and various metal chlorides as the raw material, carbonate as the precursor was prepared, was dried, and oxidized under various oxidation conditions to obtain various types of target raw materials. Specifically, a metal salt solution (chloride solution, sulfate solution or nitrate solution) was charged in a lithium carbonate suspension to precipitate carbonate. The amount of lithium carbonate suspension (w: mole) was decided according to the following formula.

[w=amount of all metal components (mole)×(1+0.5x), provided that x: Li content/amount of all metal components required in the positive electrode material]

The prepared carbonate precursor was further subject to oxidation treatment in the atmosphere at 800 to 1100° C. for 1 to 10 hours to obtain various target raw materials.

EXAMPLES 1 to 24, COMPARATIVE EXAMPLES 1 to 6

<Preparation of Target Raw Material>

As described above, lithium carbonate was dissolved and suspended in water, and droplets of metal salt solution with prescribed amounts of dissolved Ni salt, Mn salt, and Co salt were added to prepare carbonate.

Table 1, Table 2, and Table 3 show the unitary ($LiCoO_2$, $LiNiO_2$), binary ($LiMnCoO_2$, $LiMnNiO_2$, $LiCoNiO_2$), and ternary ($LiMnCoNiO_2$) raw materials.

As the metal salt, chloride, sulfate or nitrate was used. Regarding the Li/metal ratio contained in the precursor and the Li/metal ratio of the target raw material, the composition was analyzed with ICP. The results are respectively shown in Table 1 (Examples 1 to 8, Comparative Example 1-2), Table 2 (Examples 9 to 20, Comparative Examples 3 to 5), and Table 3 (Examples 21 to 24, Comparative Example 6).

The carbonate precursor was subject to oxidation treatment in the atmosphere at 930° C. for 3 hours to obtain target raw material powder for use in a positive electrode thin film. It was confirmed that this raw material powder was hexagonal crystalline system with X-ray diffraction.

(Preparation of Target)

The target raw material powder was uniaxially pressed and sintered in the atmosphere. The sintering was performed at a temperature that was higher by 150° C. to 250° C. than the oxidation treatment temperature in order to prepare the target. The composition was analyzed with ICP, and the Li/metal ratios of the targets were as shown in Tables 1, 2, and 3, respectively.

It has been confirmed with XRD diffraction that the target has a layered structure. The relative density was sought by measuring the target density with the Archimedian method, and comparing it with the XRD density. The grain size was sought with the section method from the optical micrograph of the polished surface. The relative density of the target exceeded 90% in all cases, and the average grain size was 5 to 40 μm.

(Preparation of Thin Film with Sputtering)

This target was machined and provided with a Cu backing plate to obtain a sputtering target, and this was used to prepare a thin film with a sputtering device for use with 3-inch substrates. The thin film was deposited on a glass substrate heated to 500° C. The deposition was performed at roughly 5000 Å.

The generation of particles is caused by the generation of nodules on the target substrate during deposition, and generally it becomes more difficult for nodules to be generated with higher density. Moreover, the finer the grain size, more uniform the film tended to be with less generation of particles.

The deposition status of Examples 1 to 8 and Comparative Examples 1 and 2 is summarized in Table 1 (unitary material: $LiCoO_2$, $LiNiO_2$), the deposition status of Examples 9 to 20 and Comparative Examples 3 to 5 is summarized in Table 2 (binary material: $LiMnCoO_2$, $LiMnNiO_2$, $LiCoNiO_2$), and the deposition status of Examples 21 to 24 and Comparative Example 6 is summarized in Table 3 (ternary material: $LiMnCoNiO_2$). The deposition status was determined from the status of generation of particles, and is indicated as "YES" or "NO."

As shown in Table 1, with an unitary material ($LiCoO_2$, $LiNiO_2$), although the generation of particles was observed in Comparative Example 1 and Comparative Example 2 where the Li/transition metal molar ratio of the precursor was 1.4 (condition exceeding the 1.3 molar ratio of the present invention), there was no generation of particles in Examples 1 to 8 where the Li/transition metal molar ratio of the precursor was within the range of 1.1 to 1.3. Like this, it is evident that the adjustment of the Li/transition metal molar ratio of the precursor is effective in preventing the generation of particles.

As shown in Table 2, with a binary material ($LiMnCoO_2$, $LiMnNiO_2$, $LiCoNiO_2$), although the generation of particles was observed in Comparative Example 3, Comparative Example 4, and Comparative Example 5 where the Li/transition metal molar ratio of the precursor was 1.4 (condition exceeding the 1.3 molar ratio of the present invention), there was no generation of particles in Examples 9 to 20 where the Li/transition metal molar ratio of the precursor was within the range of 1.1 to 1.3. Like this, it is evident that the adjustment of the Li/transition metal molar ratio of the precursor is similarly effective in preventing the generation of particles.

As shown in Table 3, with a ternary material ($LiMnCoNiO_2$), although the generation of particles was observed in Comparative Example 6 where the Li/transition metal molar ratio of the precursor was 1.4 (condition exceeding the 1.3 molar ratio of the present invention), there was no generation of particles in Examples 21 to 24 where the Li/transition metal molar ratio of the precursor was within the range of 1.1 to 1.3. Like this, it is evident that the adjustment of the Li/transition metal molar ratio of the precursor is similarly effective in preventing the generation of particles.

TABLE 1

Unitary Material

| | | Li/transition Metal Molar Ratio | | | Generation of Particles |
|---|---|---|---|---|---|
| | | Precursor | Target Material | Target | |
| $LiCoO_2$ | Example 1 | 1.0 | 0.95 | 0.92 | no |
| | Example 2 | 1.1 | 1.06 | 1.03 | no |
| | Example 3 | 1.2 | 1.15 | 1.05 | no |
| | Example 4 | 1.3 | 1.24 | 1.12 | no |
| | Comparative Example 1 | 1.4 | 1.33 | 1.22 | yes |
| $LiNiO_2$ | Example 5 | 1.0 | 0.94 | 0.91 | no |
| | Example 6 | 1.1 | 1.04 | 1.01 | no |
| | Example 7 | 1.2 | 1.15 | 1.05 | no |
| | Example 8 | 1.3 | 1.24 | 1.13 | no |
| | Comparative Example 2 | 1.4 | 1.35 | 1.24 | yes |

TABLE 2

Binary Material

| | | Li/transition Metal Molar Ratio | | | Generation of Particles |
|---|---|---|---|---|---|
| | | Precursor | Target Material | Target | |
| LiMnCoO$_2$ (Mn/Co = 1) | Example 9 | 1.0 | 0.95 | 0.92 | no |
| | Example 10 | 1.1 | 1.04 | 1.00 | no |
| | Example 11 | 1.2 | 1.13 | 1.03 | no |
| | Example 12 | 1.3 | 1.22 | 1.14 | no |
| | Comparative Example 3 | 1.4 | 1.33 | 1.22 | yes |
| LiMnNiO$_2$ (Mn/Ni = 1) | Example 13 | 1.0 | 0.94 | 0.92 | no |
| | Example 14 | 1.1 | 1.05 | 1.01 | no |
| | Example 15 | 1.2 | 1.14 | 1.04 | no |
| | Example 16 | 1.3 | 1.24 | 1.15 | no |
| | Comparative Example 4 | 1.4 | 1.33 | 1.22 | yes |
| LiCoNiO$_2$ (Co/Ni = 1) | Example 17 | 1.0 | 0.95 | 0.92 | no |
| | Example 18 | 1.1 | 1.05 | 1.02 | no |
| | Example 19 | 1.2 | 1.15 | 1.05 | no |
| | Example 20 | 1.3 | 1.24 | 1.14 | no |
| | Comparative Example 5 | 1.4 | 1.33 | 1.22 | yes |

TABLE 3

Ternary Material

| | | Li/transition Metal Molar Ratio | | | Generation of Particles |
|---|---|---|---|---|---|
| | | Precursor | Target Material | Target | |
| LiNiMnCoO$_2$ (Ni:Mn:Co = 1:1:1) | Example 21 | 1.0 | 0.95 | 0.92 | no |
| | Example 22 | 1.1 | 1.05 | 1.02 | no |
| | Example 23 | 1.2 | 1.15 | 1.05 | no |
| | Example 24 | 1.3 | 1.25 | 1.13 | no |
| | Comparative Example 6 | 1.4 | 1.35 | 1.23 | yes |

EXAMPLES 25 TO 42, COMPARATIVE EXAMPLES 7 TO 18

<Examination of Peak Intensity Ratio and Generation Status of Particles of Target based on X-ray Diffraction>

A precursor having a Li/transition metal molar ratio of 1.15 was prepared, and this was subject to the same oxidation treatment as described above in order to obtain target raw material powder. The Li/transition metal molar ratio of the target raw material powder at this time was 1.10. It was confirmed that this target raw material powder showed a hexagonal system with X-ray diffraction. This raw material powder was used to prepare a target with temperature that is also 150 to 250° C. higher than the oxidation treatment temperature. The peak intensity of the (101) face, (003) face, and (104) face of the obtained target was examined with X-ray diffraction.

The results are summarized in Table 4 (unitary material: LiCoO$_2$, LiNiO$_2$), Table 5 (binary material: LiMnCoO$_2$, LiMnNiO$_2$, LiCoNiO$_2$) and Table 6 (ternary material: LiMnCoNiO$_2$). The deposition status was determined from the status of generation of particles, and is indicated as "YES" or "NO."

TABLE 4

Unitary Material

| | | Peak Intensity Ratio | | Generation of particles |
|---|---|---|---|---|
| | | I(101)/I(003) | I(101)/I(004) | |
| LiCoO$_2$ | Example 7 | 0.5 | 0.5 | yes |
| | Example 25 | 0.5 | 1.1 | no |
| | Example 26 | 0.8 | 1.1 | no |
| | Example 27 | 1.1 | 1.1 | no |
| | Comparative Example 8 | 1.3 | 1.2 | yes |
| LiNiO$_2$ | Example 9 | 0.4 | 0.5 | yes |
| | Example 28 | 0.4 | 1.1 | no |
| | Example 29 | 0.8 | 1.1 | no |
| | Example 30 | 1.1 | 1.1 | no |
| | Comparative Example 10 | 1.3 | 1.4 | yes |

TABLE 5

Binary Material

| | | Peak Intensity Ratio | | Generation of Particles |
|---|---|---|---|---|
| | | I(101)/I(003) | I(101)/I(004) | |
| LiMnCoO$_2$ (Mn/Co = 1) | Example 11 | 0.5 | 0.5 | yes |
| | Example 31 | 0.5 | 1.1 | no |
| | Example 32 | 0.8 | 1.1 | no |
| | Example 33 | 1.1 | 1.1 | no |
| | Comparative Example 12 | 1.3 | 1.2 | yes |
| LiMnNiO$_2$ (Mn/Ni = 1) | Example 13 | 0.2 | 0.3 | yes |
| | Example 34 | 0.5 | 1.1 | no |
| | Example 35 | 0.8 | 1.4 | no |
| | Example 36 | 1.1 | 1.8 | no |
| | Comparative Example 14 | 1.3 | 1.8 | yes |
| LiCoNiO$_2$ (Co/Ni = 1) | Example 15 | 0.5 | 0.7 | yes |
| | Example 37 | 0.5 | 1.1 | no |
| | Example 38 | 0.8 | 1.1 | no |
| | Example 39 | 1.1 | 1.2 | no |
| | Comparative Example 16 | 1.3 | 1.4 | yes |

TABLE 6

Ternary Material

| | | Peak Intensity Ratio | | Generation of particles |
|---|---|---|---|---|
| | | I(101)/I(003) | I(101)/I(004) | |
| LiNiMnCoO$_2$ (Ni:Mn:Co = 1:1:1) | Comparative Example 17 | 0.3 | 0.5 | yes |
| | Example 40 | 0.5 | 1.1 | no |
| | Example 41 | 0.8 | 1.1 | no |
| | Example 42 | 1.1 | 1.3 | no |
| | Comparative Example 18 | 1.3 | 1.4 | yes |

As shown in Table 4, with an unitary material (LiCoO$_2$, LiNiO$_2$), although the generation of particles was observed in Comparative Example 7 and Comparative Example 9 where the I(101)/I(104) was small at 0.5 (condition exceeding 1.0 or higher of the present invention) and in Comparative Example 8 and Comparative Example 10 where the I(101)/I(003) was large at 1.3 (less than the condition of 1.1 or less of the present invention), there was no generation of particles in Examples 25 to 30 where the I(101)/I(104) was at 1.1 and where the I(101)/I(003) was in the range of 0.4 to 1.1. Like this, it is evident that the adjustment of the peak intensity of the (101) face, (003) face, and (104) face of the target is effective in preventing the generation of particles.

As shown in Table 5, with a binary material (LiMnCoO$_2$, LiMnNiO$_2$, LiCoNiO$_2$), although the generation of particles was observed in Comparative Example 11, Comparative Example 13, and Comparative Example 15 where the I(101)/I(104) was small at 0.5, 0.3, and 0.7 (less than the condition of 1.0 or higher of the present invention) and in Comparative Example 12, Comparative Example 14, and Comparative Example 16 where the I(101)/I(003) was large at 1.3 (condition exceeding 1.1 or less of the present invention). Incidentally, Comparative Example 13 was also outside the lower limit of I(101)/I(003).

Meanwhile, there was no generation of particles in Examples 31 to 39 where the I(101)/I(104) was within the range of 1.1 to 1.8 and where the I(101)/I(003) was in the range of 0.4 to 1.1. Like this, it is evident that the adjustment of the peak intensity of the (101) face, (003) face, and (104) face of the target is effective in preventing the generation of particles.

As shown in Table 6, with a ternary material (LiMnCoNiO$_2$), although the generation of particles was observed in Comparative Example 17 where the I(101)/I(104) was small at 0.5 (less than the condition of 1.0 or higher of the present invention) and in Comparative Example 18 where the I(101)/I(003) was large at 1.3 (condition exceeding 1.1 or less of the present invention). Incidentally, Comparative Example 17 was also outside the lower limit of I(101)/I(003).

Meanwhile, there was no generation of particles in Examples 40 to 42 where the I(101)/I(104) was within the range of 1.1 to 1.3 and where the I(101)/I(003) was in the range of 0.4 to 1.1. Like this, it is evident that the adjustment of the peak intensity of the (101) face, (003) face, and (104) face of the target is effective in preventing the generation of particles.

(Evaluation of Thin Film Prepared by Sputtering)

Regarding the samples of Examples 1 to 42, the Raman spectrum of the prepared thin film was measured and it has been confirmed that the crystalline structure of the film has a layered structure.

(Evaluation of Battery Characteristics)

Al foil was used in substitute for a glass substrate, a thin film was formed under the same conditions as Example 42, and the battery characteristics were measured using the thin film as the positive electrode. A 2032-type coin cell for evaluation with Li as the counter electrode was prepared, 1 M-LiPF6 was dissolved in the electrolytic solution to EC-DMC (1:1), and this used in the charging and discharging under the charging conditions of CCCV at 4.3V and discharging conditions of CC at 3.0V. The obtained results were the initial charged capacity of 165 mAh/g, initial discharged capacity of 150 mAh/g, and initial efficiency of 91%. The electrochemical function as the thin film positive electrode was thereby confirmed.

The present invention is able to provide a lithium-containing transition metal oxide target optimal for forming a thin film positive electrode for use in a thin film battery such as a three-dimensional battery and a solid state battery, also proposed are its production method and a lithium ion thin film secondary battery. Since a superior effect is yielded in that there will be no generation of particles by performing sputtering with this target and it is possible to obtain a thin film with superior homogeneity, the present invention is useful as a material for use in a lithium ion thin film secondary battery, and yields a significant effect of being applicable to the miniaturization of the battery.

The invention claimed is:

1. A lithium-containing transition metal oxide sputtering target for forming a thin film positive electrode of a lithium ion thin film secondary battery, formed from a sintered compact of lithium-containing transition metal oxides showing a hexagonal crystalline system, wherein the sintered compact has a relative density of 90% or higher and an average grain size of 1 μm or greater and 50 μm or less.

2. A lithium-containing transition metal oxide sputtering target for forming a thin film positive electrode of a lithium ion thin film secondary battery according to claim 1, wherein an intensity ratio of a (003) face, (101) face and (104) face based on X-ray diffraction using CuK a ray satisfies the following conditions: (1) Peak ratio of the (101) face in relation to the (003) face is 0.4 or higher and 1.1 or lower; and (2) Peak ratio of the (101) face in relation to the (104) face is 1.0 or higher.

3. The lithium-containing transition metal oxide target according to claim 2, wherein the transition metal is at least one selected from Ni, Co, and Mn.

4. The production method of a lithium ion thin film secondary battery, wherein a lithium-containing transition metal oxide is used as the cathode active material by sputtering the lithium-containing transition metal oxide target according to claim 2.

5. The lithium-containing transition metal oxide target according to claim 1, wherein the transition metal is at least one selected from Ni, Co, and Mn.

6. The production method of a lithium ion thin film secondary battery, wherein a lithium-containing transition metal oxide is used as the cathode active material by sputtering the lithium-containing transition metal oxide target according to claim 1.

7. The lithium-containing transition metal oxide target according to claim 1, wherein the transition metal is Ni.

8. The lithium-containing transition metal oxide target according to claim 1, wherein the target contains at least two different transition metals selected from the group consisting of Ni, Co and Mn.

9. The lithium-containing transition metal oxide target according to claim 1, wherein the target contains three different transition metals including Ni, Co and Mn.

10. A production method of a lithium-containing transition metal oxide sputtering target for forming a thin film positive electrode of a lithium ion thin film secondary battery, comprising the steps of using lithium-containing transition metal salt as a precursor in which the molar ratio of Li/transition metal is 1.1 or more and 1.3 or less, oxidizing this to create lithium-containing transition metal oxides showing a hexagonal crystalline system, and pressing and sintering the lithium-containing transition metal oxides to obtain a sintered compact having a relative density of 90% or higher and an average grain size of 1 μm or greater and 50 μm or less.

11. The production method of a lithium-containing transition metal oxide sputtering target according to claim 10, wherein the lithium-containing transition metal oxide sputtering target for forming a thin film positive electrode of a lithium ion thin film secondary battery, is formed from the sintered compact of lithium-containing transition metal oxides showing the hexagonal crystalline system, and wherein an intensity ratio of a (003) face, (101) face and (104) face based on X-ray diffraction using CuK a ray satisfies the following conditions: (1) Peak ratio of the (101) face in relation to the (003) face is 0.4 or higher and 1.1 or lower; and (2) Peak ratio of the (101) face in relation to the (104) face is 1.0 or higher.

12. The production method of a lithium-containing transition metal oxide target according to claim 11, wherein the transition metal is at least one selected from Ni, Co, and Mn.

13. The production method of a lithium ion thin film secondary battery, wherein a lithium-containing transition metal oxide is used as the cathode active material by sputtering the lithium-containing transition metal oxide target according to claim 10.

14. The production method of a lithium-containing transition metal oxide target according to claim 10, wherein the transition metal is at least one selected from Ni, Co, and Mn.

* * * * *

UNITED STATES PATENT AND TRADEMARK OFFICE
CERTIFICATE OF CORRECTION

| | | |
|---|---|---|
| PATENT NO. | : 8,062,486 B2 | |
| APPLICATION NO. | : 12/297320 | |
| DATED | : November 22, 2011 | |
| INVENTOR(S) | : Ryuichi Nagase et al. | |

It is certified that error appears in the above-identified patent and that said Letters Patent is hereby corrected as shown below:

Column 2, line 65 "No. H1" should read "No. H11".

Signed and Sealed this
Fifteenth Day of May, 2012

David J. Kappos
*Director of the United States Patent and Trademark Office*